(12) United States Patent
Cheng et al.

(10) Patent No.: US 7,833,872 B2
(45) Date of Patent: Nov. 16, 2010

(54) UNIFORM RECESS OF A MATERIAL IN A TRENCH INDEPENDENT OF INCOMING TOPOGRAPHY

(75) Inventors: Kangguo Cheng, Guilderland, NY (US); Johnathan E. Faltermeier, Lagrangeville, NY (US); Xi Li, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 11/931,112

(22) Filed: Oct. 31, 2007

(65) Prior Publication Data

US 2009/0108306 A1 Apr. 30, 2009

(51) Int. Cl.
*H01L 21/20* (2006.01)
*H01L 21/311* (2006.01)

(52) U.S. Cl. .............. 438/386; 438/699; 438/430; 257/E21.651

(58) Field of Classification Search ............ 438/430, 438/699, 386; 257/E21.651
See application file for complete search history.

(56) References Cited

U.S. PATENT DOCUMENTS

| | | | | |
|---|---|---|---|---|
| 5,683,945 A | * | 11/1997 | Penner et al. | 438/702 |
| 6,004,844 A | * | 12/1999 | Alsmeier et al. | 438/246 |
| 6,194,313 B1 | | 2/2001 | Singh et al. | |
| 6,232,233 B1 | * | 5/2001 | Chaudhary | 438/706 |
| 6,396,121 B1 | * | 5/2002 | Bertin et al. | 257/530 |
| 6,426,252 B1 | * | 7/2002 | Radens et al. | 438/243 |
| 6,482,716 B1 | | 11/2002 | Wohlfarht | |
| 6,566,177 B1 | | 5/2003 | Radens et al. | |
| 6,699,794 B1 | * | 3/2004 | Flietner et al. | 438/700 |
| 6,953,724 B2 | | 10/2005 | Edleman et al. | |

* cited by examiner

*Primary Examiner*—Michael S. Lebentritt
*Assistant Examiner*—Aaron A Dehne
(74) *Attorney, Agent, or Firm*—Daryl K. Neff; H. Daniel Schnurmann

(57) ABSTRACT

Columnar elements which extend to varying heights above a major surface of a substrate, e.g., polysilicon studs within trenches in the substrate, are recessed to a uniform depth below the major surface. The columnar elements are etched selectively with respect to a material exposed at the surface in an at least partly lateral direction so that the columnar elements are recessed to a uniform depth below the major surface at walls of the trenches.

1 Claim, 8 Drawing Sheets

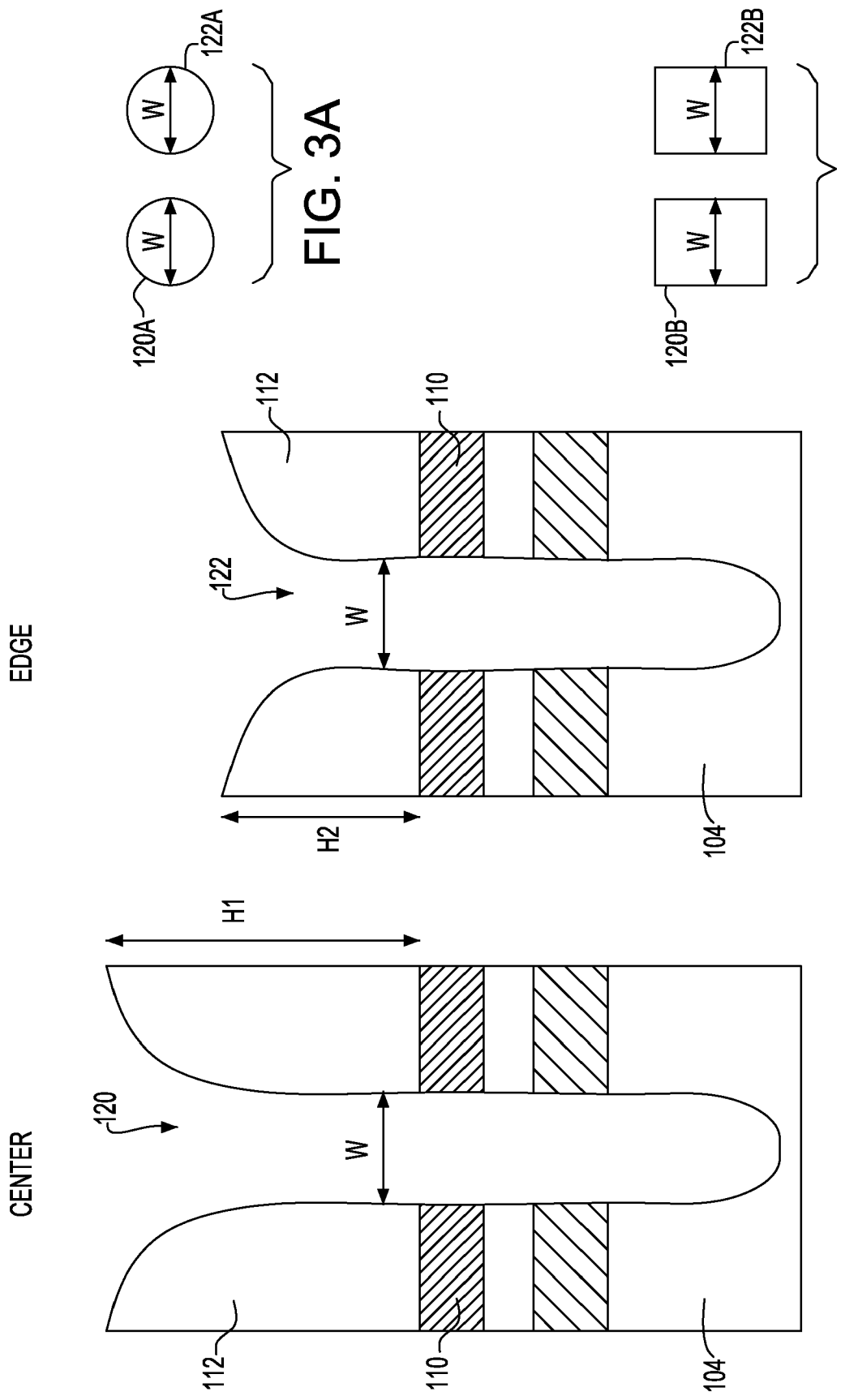

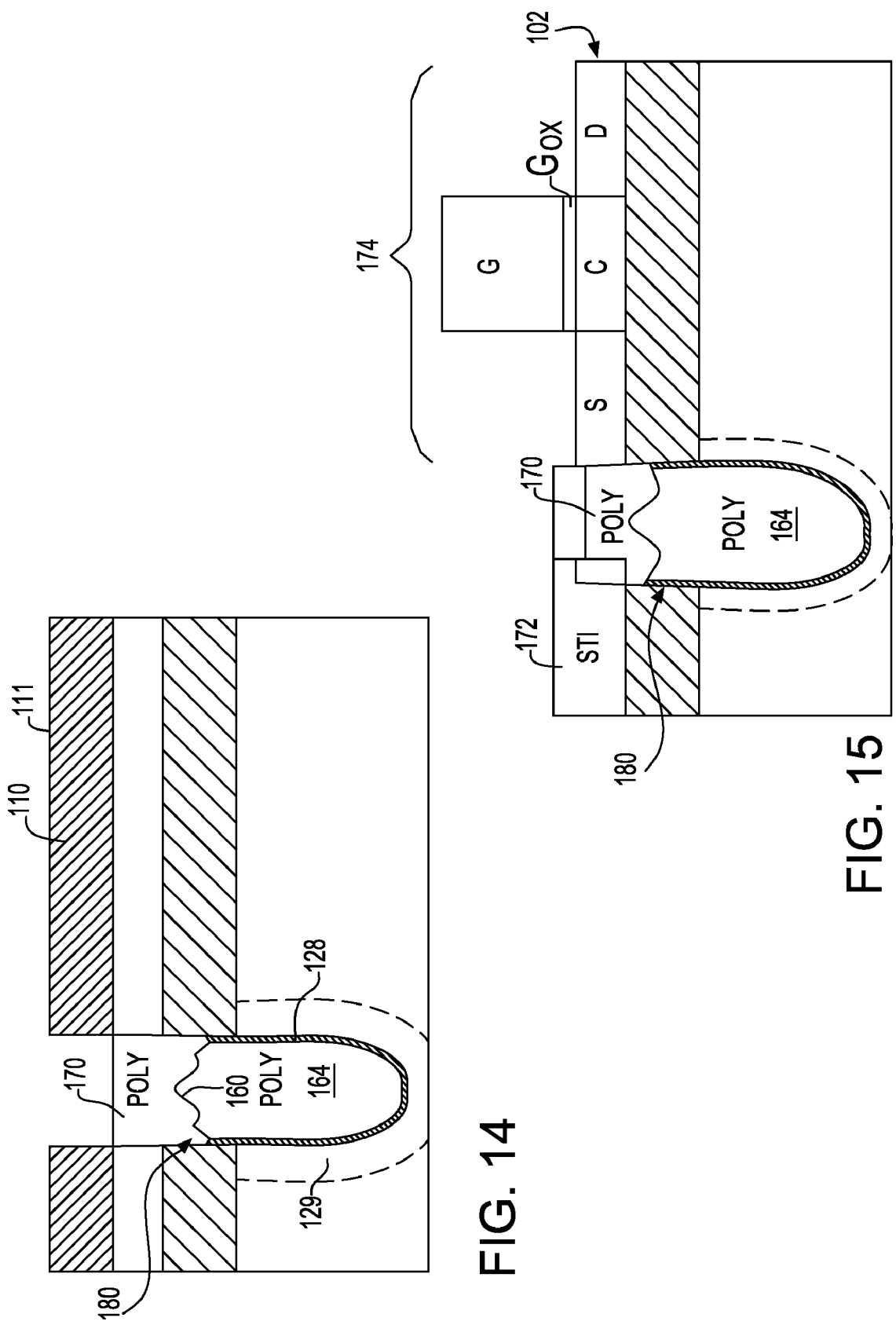

UNIFORM RECESS OF A MATERIAL IN A TRENCH INDEPENDENT OF INCOMING TOPOGRAPHY

BACKGROUND OF THE INVENTION

The present invention relates to microelectronic elements and their fabrication.

In the fabrication of microelectronic elements such as integrated circuits and other devices on semiconductor chips, trenches can be formed in a semiconductor substrate such as a wafer, which are then filled with a material. Subsequently, the material filling the trenches is recessed to a given depth below a major surface of the substrate. For example, in the fabrication of trench capacitors, it is common to fill trenches in the substrate with a polycrystalline semiconductor material such as polysilicon. Subsequently, the polysilicon within the trenches is recessed to a given depth below a major surface of the substrate.

Achieving a uniform recess depth when recessing the deposited polysilicon within trenches can be particularly challenging because of variations in height of existing material layers across the major surface of a wafer. Particularly, the thicknesses of the polysilicon and other deposited layers can vary substantially between the center of the wafer and the edge of the wafer. A substantial variation in topography between the center of the wafer and the edge before beginning to recess the deposited material can lead to significant non-uniform recess depth, even when uniform polysilicon deposition and etching processes are utilized. Conventional methods of processing involve process complexity, significant cost, and are subject to difficulties which can make defects difficult to manage within acceptable levels.

In light of the aforementioned difficulties of processes used to recess materials within trenches, it would be desirable to provide improved processes which allow a more uniform recess depth to be achieved despite topography of the substrate prior to beginning to recess the material.

SUMMARY OF THE INVENTION

In accordance with an aspect of the invention, a method is provided for recessing material within trenches in a substrate to a uniform depth. In such method a material included in studs protruding from within trenches to varying heights above a major surface of the substrate is selectively etched until the material is recessed in the trenches to a first uniform depth below the major surface. In accordance with one aspect of the invention, columnar elements which extend to varying heights above a major surface of a substrate, e.g., polysilicon studs within trenches in the substrate, are recessed to a uniform depth below the major surface. The columnar elements are etched selectively with respect to a material exposed at the surface in an at least partly lateral direction so that the columnar elements are recessed to a uniform depth below the major surface at walls of the trenches.

In accordance with another aspect of the invention, a microelectronic element includes a trench extending downwardly from a major surface of a substrate. A layer of material disposed in the trench has a top surface. At a center of the trench away from a wall of the trench the top surface has a first depth below the major surface, and at the wall of the trench the top surface has a second depth, the second depth being greater than the first depth.

In a particular embodiment of the invention, at a location between the wall and the center of the trench, the top surface of the layer may be disposed at a third depth below the major surface, the third depth being greater than each of the first and second depths such that the contour of the top surface when viewed in cross section has the appearance of a "W". Stated another way, the layer can have relatively greater height at the walls of the trenches and at a location distal from the walls. At locations between the walls and the distal location, the layer can have lower height, such that the top surface of the layer may undulate.

BRIEF DESCRIPTION OF THE DRAWINGS

FIGS. 2A and 2B are sectional views at center and edge locations of a wafer, respectively, illustrating a stage of fabrication in which trenches are formed in the structure illustrated in FIG. 1 in accordance with an embodiment of the invention.

FIGS. 3A and 3B are each plan views illustrating shapes of trench openings formed in the structure shown in FIGS. 2A-B in accordance with an embodiment of the invention.

FIG. 14 illustrates a stage of fabrication subsequent to that shown in FIGS. 12 and 13 in which a second layer of material is formed over the existing layer of material within the trench.

FIG. 15 illustrates a stage of fabrication subsequent to that shown in FIG. 14 in which a semiconductor device is formed in an active semiconductor region which is conductively connected to the layer of material within the trench.

DETAILED DESCRIPTION

Accordingly, methods and structures are provided herein in which a material within trenches in a substrate, e.g. a semiconductor wafer, can be recessed to a uniform depth, despite differences in height of incoming topography across the wafer. For example, a polysilicon material within trenches in a semiconductor wafer can be recessed to a uniform depth therein even when the height of topography across the wafer varies prior to the beginning of such recess process.

Figure 1:
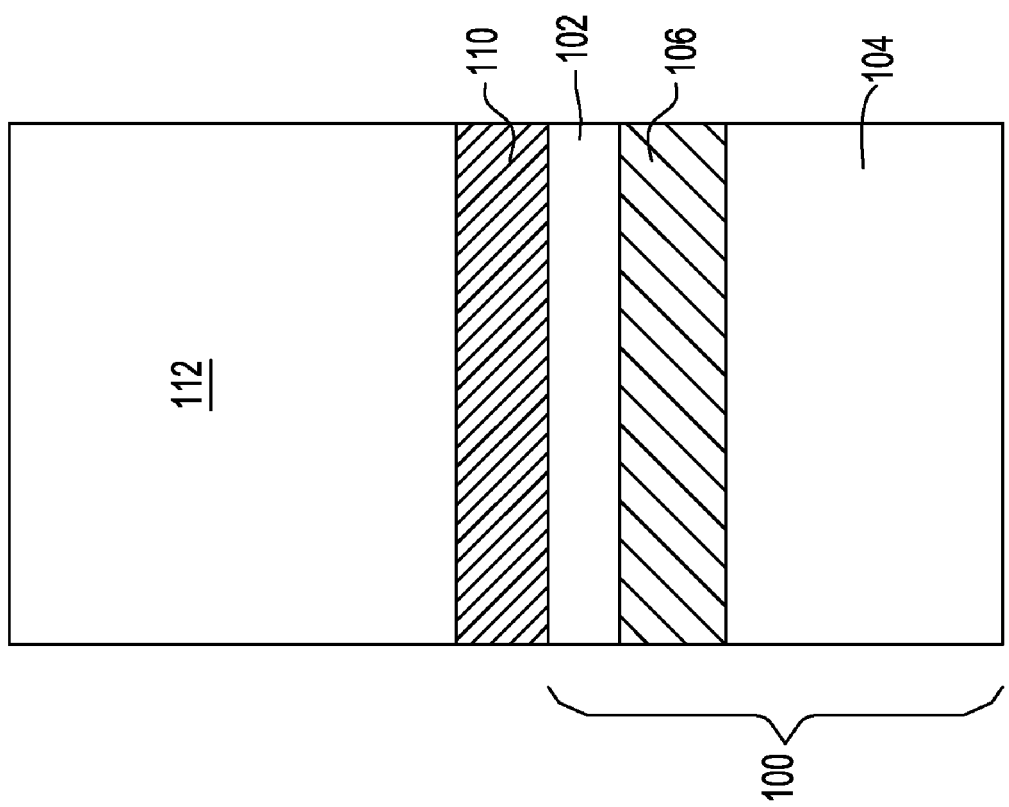
FIG. 1 is a sectional view illustrating a structure of an SOI wafer over which masking layers are disposed at a preliminary stage in a method in accordance with an embodiment of the invention.

Referring to FIG. 1, a process will now be described for forming trenches and depositing and recessing a material therein in accordance with an embodiment of the invention. FIG. 1 illustrates a semiconductor-on-insulator ("SOI") wafer 100, with additional masking layers 110, 112 or dielectric layers thereon, as the SOI wafer may appear prior to etching of trenches therein. The SOI wafer includes a single-crystal semiconductor-on-insulator (SOI) region 102 which is separated from a bulk semiconductor region 104 by a buried dielectric region 106 such as buried oxide ("BOX") region. In a particular embodiment, the SOI region 102 consists essentially of single-crystal silicon. Alternatively, the SOI region can include a single-crystal alloy of silicon with another element such as germanium, silicon germanium, or carbon doped silicon. Alternatively, the SOI region can include a plurality of regions of single-crystal semiconductor material, some consisting essentially of silicon and others consisting essentially of an alloy of silicon. In other illustrative examples, a bulk semiconductor wafer is provided instead of an SOI wafer. Overlying a major surface of the wafer 100 are masking layers including a pad layer 110 consisting essentially of silicon nitride and an optional silicon oxide layer underneath the silicon nitride, for example, and a hard mask layer 112, which may consist essentially of an oxide such as silicon oxide, for example. Typically, the oxide material can be deposited using relatively low temperature techniques, such as deposition from a TEOS (tetraethylorthosilicate) precursor or a silane precursor, for example.

Subsequently, as illustrated in FIGS. 2A-B, trenches 120, 122 are patterned which extend into the bulk semiconductor region 104 of the SOI wafer. For examples, trenches having depths from about one micrometer ("micron" or µm) up to many microns can be formed in the substrate using the oxide layer 112 and pad layer 110 as hard mask layers. Typically, an anisotropic reactive ion etch process is used to form the trenches 120, 122 which extend through the hard mask layers 112, 110, the SOI layer 102, BOX layer 106 and into the bulk silicon region 104. FIG. 2A illustrates a resulting structure at the center of the wafer after trenches 120, 122 are etched. FIG. 2B illustrates a corresponding structure near the edge of the wafer after the trenches 120, 122 are etched. Each trench 120, 122 has a width W which is the same or almost the same, regardless of its central or edge position on the wafer. The trench dimensions typically are determined by uniform dimensions of corresponding openings of a photomask (not shown) used to lithographically define the shapes of the trenches. In a particular example, the width of the trenches is between about 40 nanometers (nm) and 500 nanometers (nm). As further illustrated in the plan view shown in FIG. 3A, the openings 120A, 122A defined by the trenches in the pad layer 110 can be essentially circular in shape. In the case of the circular shaped trench openings (FIG. 3A), the width W represents a diameter of each trench. Alternatively, the openings 120B, 122B can be rectangular or oblong in shape as illustrated in FIG. 3B. In such case, the width W can represent the smaller horizontal dimension across such rectangular shaped trenches.

One consequence of the RIE process of forming trenches is that the consumption of the oxide layer 112 varies across the wafer. For example, the oxide layer 112 is consumed to a greater extent where a trench 122 (FIG. 2B) is formed near the edge of the wafer than where trench 120 (FIG. 2A) is formed at the center of the wafer. As a result, a height H1 (FIG. 2A) of the oxide layer 112 above pad layer 110 is significantly greater at the center of the wafer than its corresponding height H2 (FIG. 2B) near the edge of the wafer. These different heights H1, H2 of the oxide layer will eventually be reflected in different heights H1', H2' of polysilicon plugs 140, 142 (FIGS. 6 and 7) formed by subsequent processing.

Figure 5:
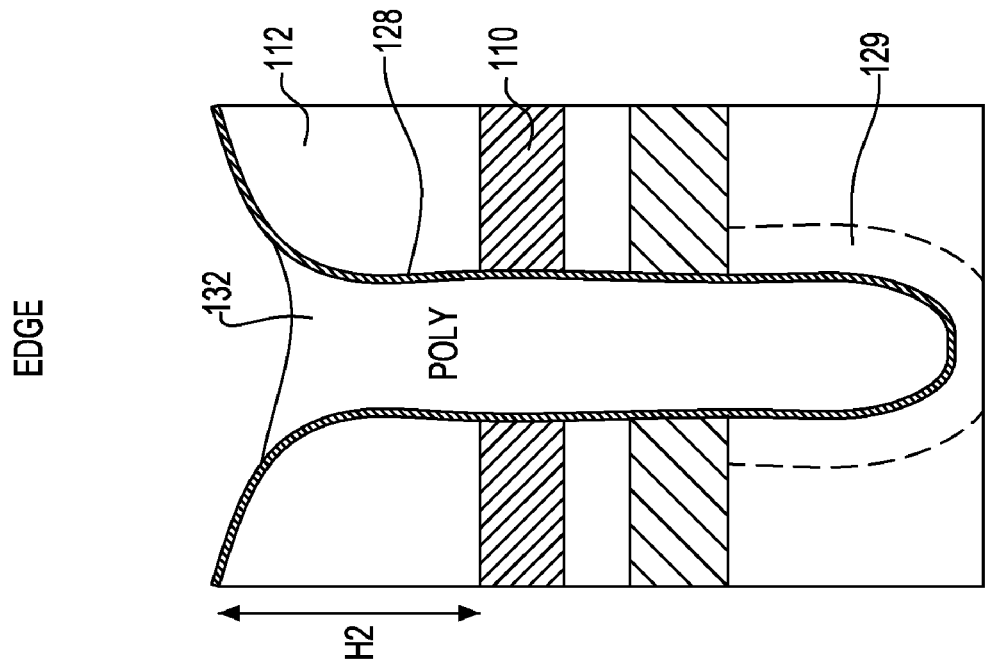
FIGS. 4 and 5 are sectional views at center and edge locations of a wafer, respectively, illustrating a subsequent stage of fabrication in accordance with an embodiment of the invention in which trenches are filled with a material such as polysilicon.
Figure 4:
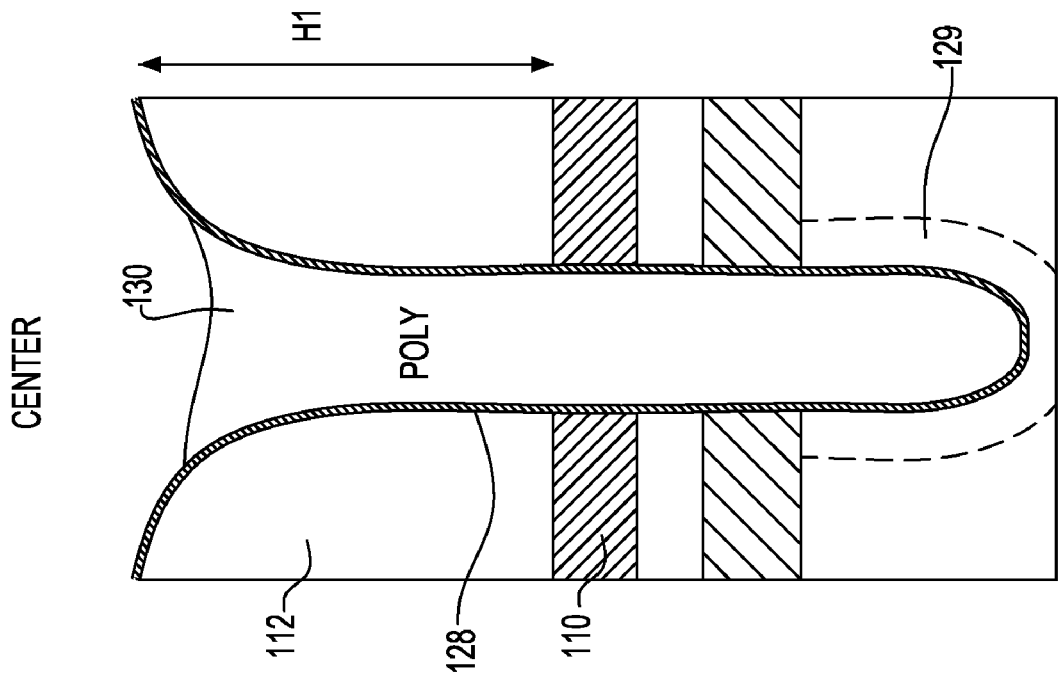

Referring to FIGS. 4 and 5, buried plate regions 129 can be formed in the bulk semiconductor region 104 surrounding each trench. The buried plate regions typically function as plates of trench capacitors which are held at a common potential. A relatively thin dielectric layer 128 is deposited to coat the walls of the trenches. The dielectric material can be a good quality dielectric layer such as silicon nitride, silicon oxide, silicon oxynitride, or a combination thereof, a high dielectric constant material, e.g., various ferroelectric dielectric materials, among others, or combination of such dielectric materials. Such dielectric layer 128 may be provided as a node dielectric layer, i.e., a capacitor dielectric of a trench capacitor to be subsequently formed.

Thereafter, polycrystalline silicon (polysilicon) or other suitable materials (e.g., amorphous silicon, amorphous silicon germanium, polycrystalline silicon germanium) is deposited to fill then trenches and then subsequently etched back, e.g., by a timed wet etch process (e.g., by a wet etching solution with an etchant containing ammonia) or a timed dry etch (e.g., chemical downstream etch (CDE) or plasma etching) to form polysilicon plugs 130, 132, as seen in FIGS. 4-5. Because of the difference between the heights H1, H2 of the oxide layer 112 at the center of the wafer and the edge of the wafer, the polysilicon plug 130 (FIG. 4) at the center of the wafer has greater height H1 from the pad layer 110 than the height H2 of the polysilicon plug 132 (FIG. 5) near the edge of the wafer.

Figure 6:
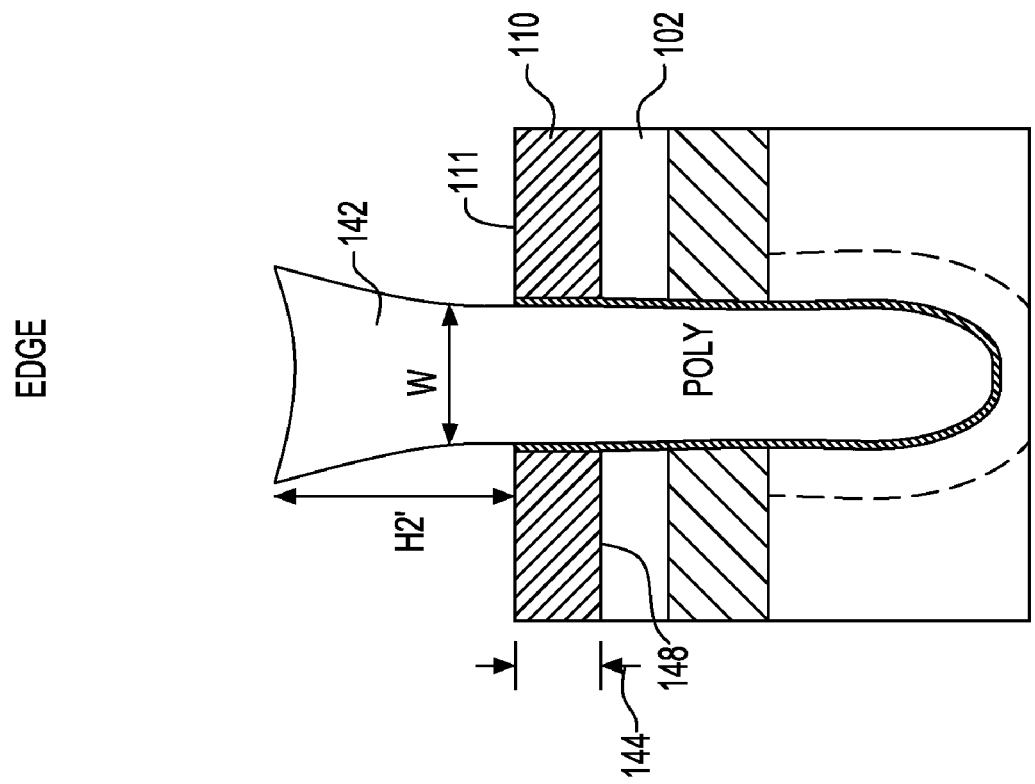
FIGS. 6 and 7 are sectional views at center and edge locations of a wafer, respectively, illustrating a subsequent stage of fabrication in accordance with an embodiment of the invention in which a hard mask layer is removed, leaving studs protruding above a major surface to varying heights.
Figure 7:
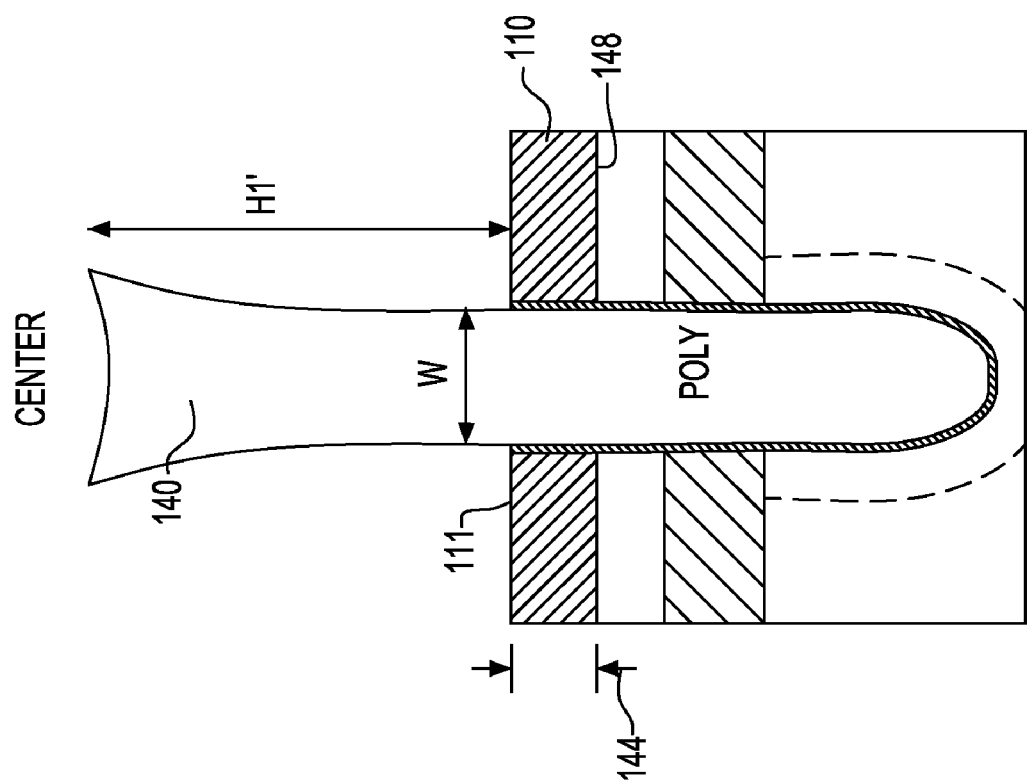

Referring to FIGS. 6 and 7, the oxide layer 112 is removed by a wet etch process which is performed selectively with respect to the material of the pad nitride layer 110 and selectively with respect to polysilicon. For example, a wet etching solution containing hydrofluoric acid can be used to selectively remove the oxide layer 113. In the resulting structure (FIGS. 6 and 7), polysilicon studs 140, 142 remain which protrude above a major surface of the pad nitride layer 110. The polysilicon studs have heights H1', H2' which follow the differences in the heights H1 and H2 of the oxide layer 112 at the center and edge locations of the wafer. The stud 140 at the center of the wafer has height H1' (FIG. 6) above a major surface 111 of the pad layer 110. However, near the edge of the wafer stud 142 has a height H2' above the major surface 111 of the pad layer which is lower than the height H1' of the stud 140 at the center. For wafers having 300 mm diameters, the heights H1', H2' of the polysilicon studs 140, 142 can be expected to vary from about 50 nanometers in height to several hundred nanometers.

As further illustrated in FIGS. 6-7, the thickness 144 (FIG. 6) of the pad layer 110 in the center of the wafer is essentially the same as the thickness 146 (FIG. 7) of the pad layer near the edge of the wafer. As a result, the heights of the studs above the major surface 148 of the SOI layer 102 of the wafer have a difference in height which is about equal to H1'-H2'.

At this stage of processing in a conventional method of processing referred to above, a complicated process could be performed to recess the polysilicon material within the trenches. In such conventional method, polysilicon could be blanket deposited to form a second polysilicon layer overlying the pad layer 110 which incorporates the polysilicon studs 140, 142 therein. Chemical mechanical polishing (CMP) could then be used to remove the second polysilicon layer together with the polysilicon studs, in a manner performed selectively with respect to the underlying pad layer 110. Subsequently, a reactive ion etch ("RIE") process could be used to recess the polysilicon within the trenches to a given depth. Such method, besides involving process complexity and significant cost, is subject to difficulties such as non-uniform erosion of the pad layer during the CMP step and undesirable defect issue.

Instead of such complicated processing, subsequent to the stage of processing illustrated in FIGS. 6 and 7, an isotropic etch process is performed selectively with respect to the material (silicon nitride) of the pad layer 110. For example, an isotropic plasma etch can be performed in a chamber into which gases such as sulfur hexafluoride ($SF_6$) and molecular chlorine ($Cl_2$) are introduced at proportional rates of flow such as 1:4 at low pressure conditions, moderate substrate temperature (e.g., 40° C.) and low power (e.g., 200 watts). Alternatively, a chemical downstream etch (CDE) can be used with a mix of tetrafluoromethane ($CF_4$) and oxygen ($O_2$).

Figure 9:
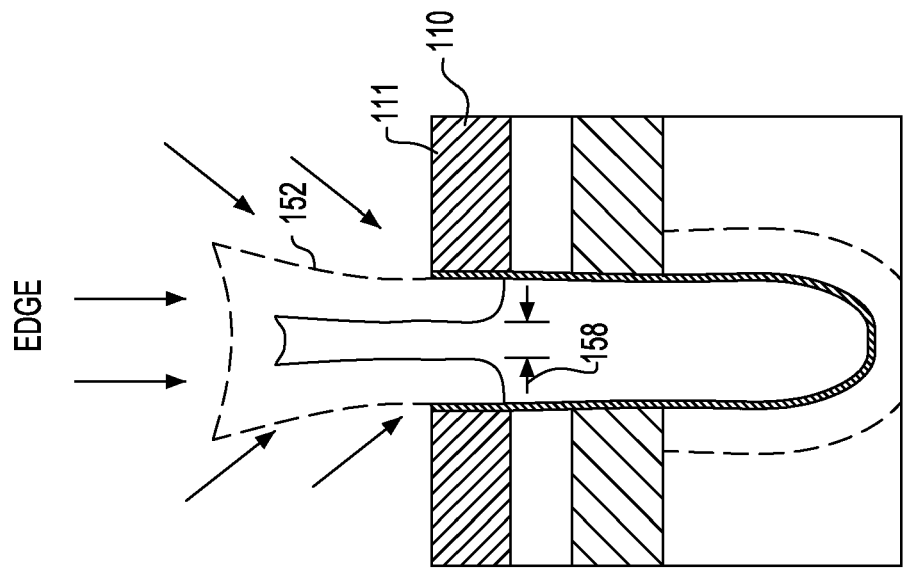
FIGS. 8 and 9 are sectional views at center and edge locations of a wafer, respectively, illustrating a stage of fabrication during performance of an isotropic etch process in accordance with an embodiment of the invention.
Figure 8:
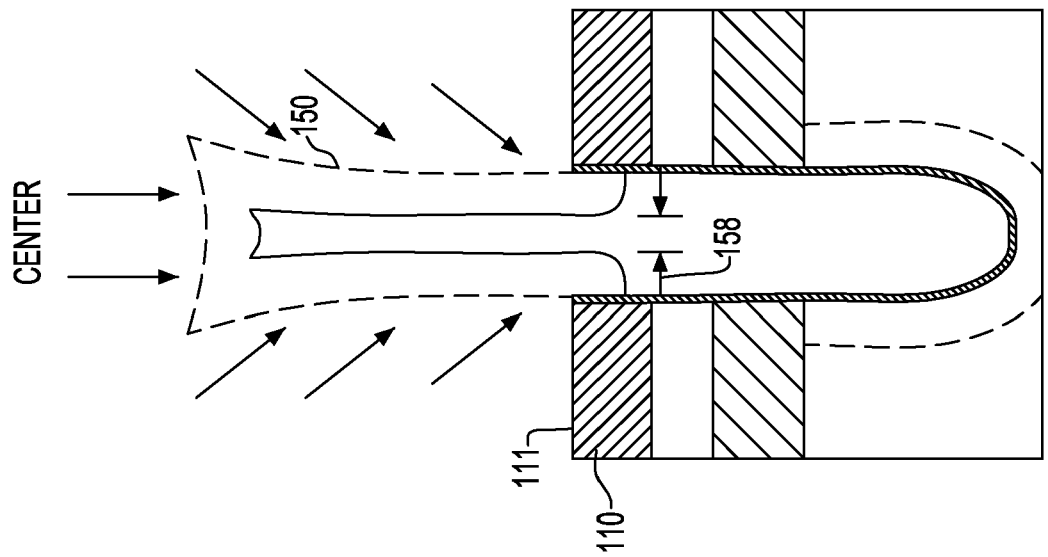

FIGS. 8 and 9 illustrate the appearance of the structure early during performance of the isotropic etch process. The isotropic etch process removes material from each stud uniformly at exposed surfaces 150 (FIG. 8), 152 (FIG. 9) denoted by dotted lines, such that the width of each stud initially decreases in width to a width 158. At the same time, the polysilicon material of each stud begins to be recessed below the major surface 111 of the pad layer 110.

Figure 11:
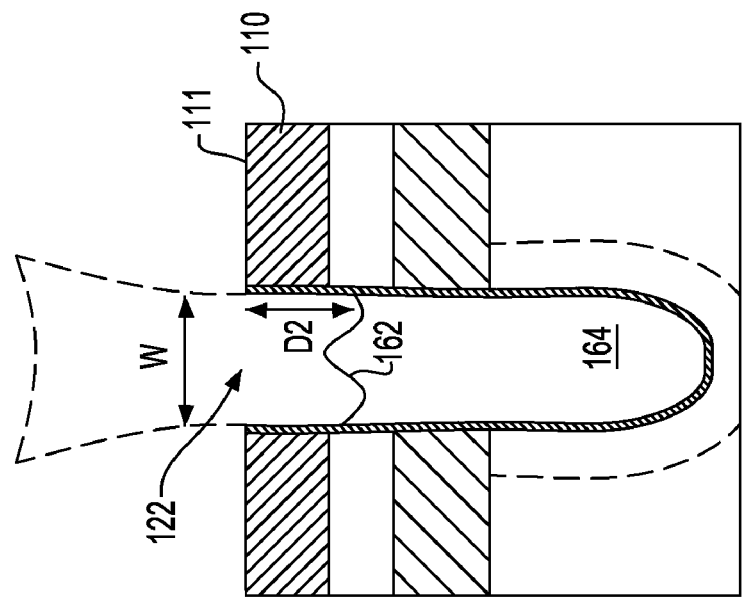
FIGS. 10 and 11 are sectional views at center and edge locations of a wafer, respectively, illustrating the appearance of the structure at a later time during performance of an isotropic etch process in accordance with an embodiment of the invention.
Figure 10:
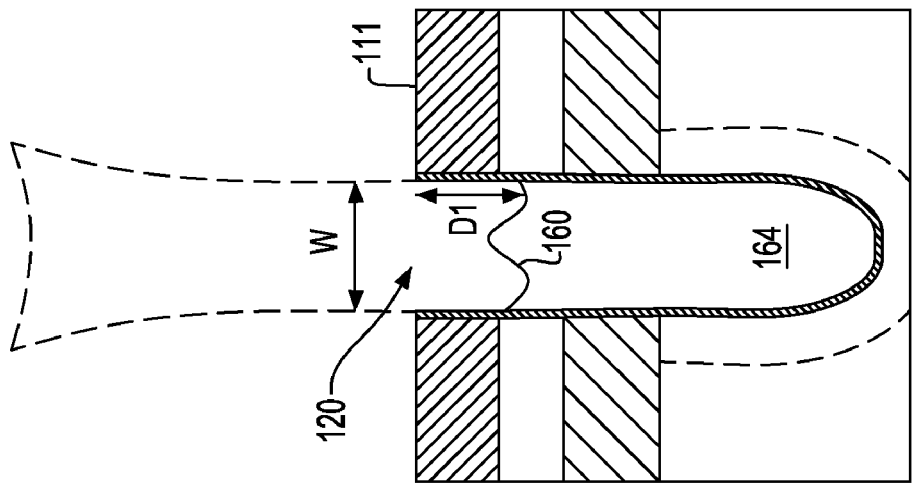

FIGS. 10 and 11 illustrate the appearance of the structure later during performance of the isotropic etch process. As illustrated therein, the polysilicon material within each trench 120, 122 has been recessed to depths D1 and D2, respectively, below the major surface 111 of the pad layer. As noted above, each trench 120, 122 has the same width W at the major surface 111 of the pad layer 110. Because of the isotropic nature of the etch process, all studs can be removed from the structure by performing the etch process for an etch time equal to or slightly greater than the width W as divided by the rate R of etching performed by the isotropic etch process. During the etch process, once the studs have been removed from above the pad layer 110, the exposed surfaces 160, 162 of the remaining polysilicon material begins to take on a characteristic contour. As viewed in cross-section in FIGS. 10 and 11, each of the exposed surfaces 160, 162 of the recessed polysilicon material 164 defines a "W" shape. Stated another way, the recessed polysilicon material 164 has greater depth where it contacts the walls of the trenches 120, 122 than at the center of the trenches 120, 122. In addition, the depths of recess D1 and D2 within the trenches at the different wafer locations are essentially the same, the depths being determined by the etch time multiplied by the etch rate R.

Figure 13:
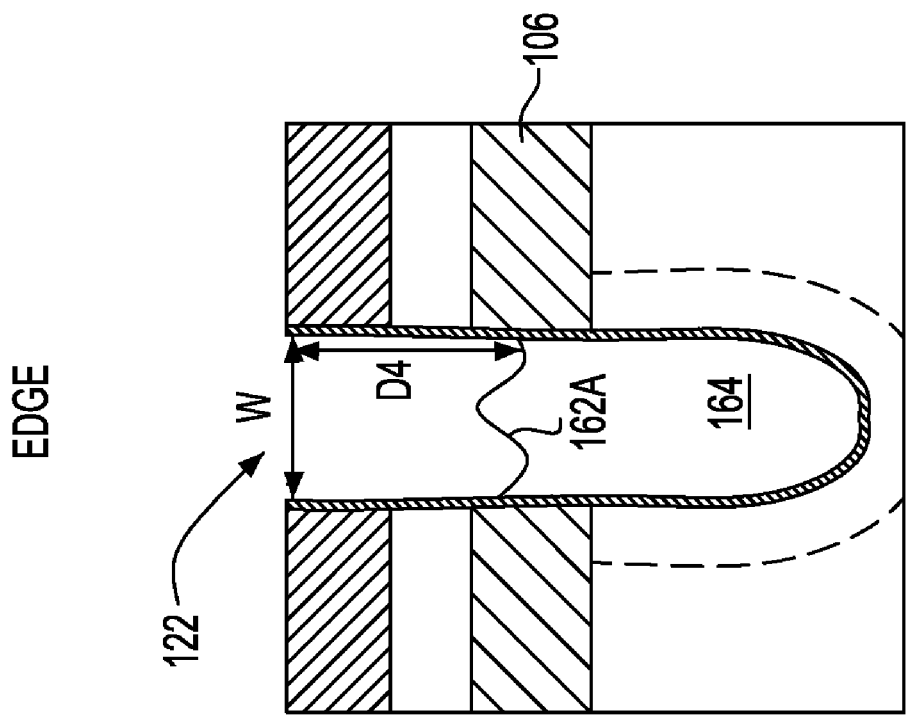
FIGS. 12 and 13 are sectional views at center and edge locations of a wafer, respectively, illustrating a stage of fabrication after recessing a material within trenches in the substrate to a desired depth in accordance with an embodiment of the invention.
Figure 12:
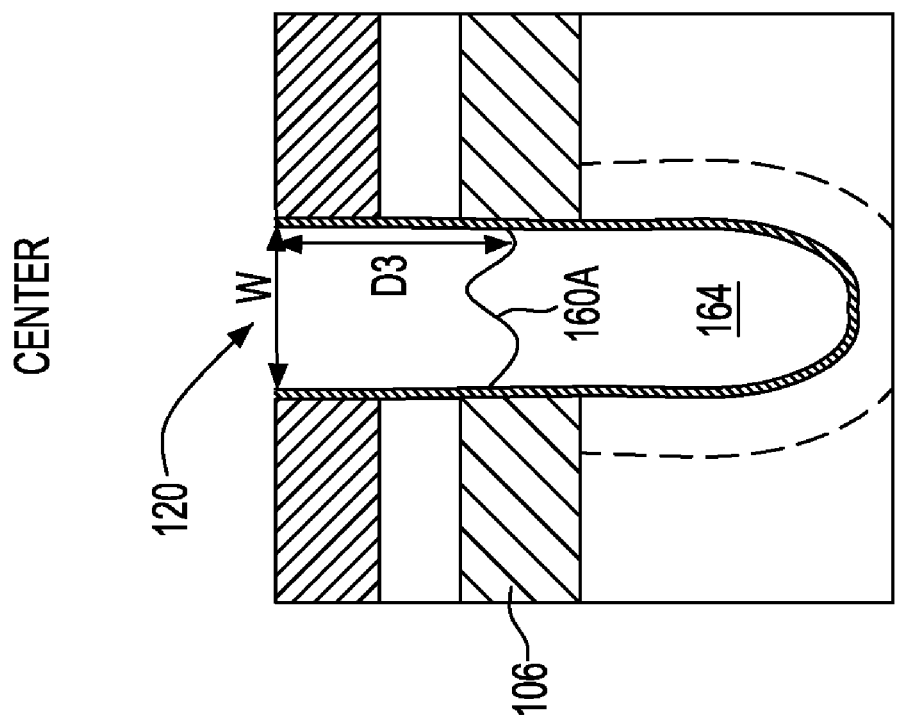

As further illustrated in FIGS. 12 and 13, the isotropic etch process is continued for a time and under conditions sufficient to further recess the polysilicon material within each trench 120, 122 to desired depths D3 (FIG. 12) and D4 (FIG. 13). For the reasons set forth above, the depths D3 and D4 are equal or nearly equal, e.g., almost exactly equal. The desired depths typically fall within the vertical boundaries of the BOX layer within the SOI substrate. In a particular example, the polysilicon material 164 may be recessed to depths from about 100 nanometers to a few hundred nanometers and greater. At the conclusion of such etch process, the recessed polysilicon material 164 may continue to exhibit characteristic "W" shaped contours 160A, 162A as viewed in cross-section.

Alternatively, at the stage of processing illustrated in FIGS. 12 and 13, instead of continuing to etch the polysilicon material within the trenches by an isotropic etch, a reactive ion etch can be performed which then etches the polysilicon material anisotropically. The anisotropic reactive ion etch can be performed for a sufficient length of time to recess the material within the trench to any desired depth with little risk of harm to silicon-containing regions of the structure, thus avoiding risk of unwanted etching of the SOI layer 102 at edges of the trenches.

Subsequent thereto, steps can be performed to form a memory device, such as, for example, a cell of a dynamic random access memory ("DRAM"). As illustrated in FIG. 14, the node dielectric layer 128 is recessed within the trench 120 to a level at or below the exposed surface 160 of the recessed polysilicon layer 164. Thereafter, a second polysilicon layer 170 is deposited and recess to a level below the exposed major surface 111 of the pad layer 110. The polysilicon layer 164 can function as a node electrode of a trench capacitor 180 in which the node dielectric layer 128 functions as a capacitor dielectric between the node electrode and a buried plate region 129 surrounding the trench.

Subsequently, as illustrated in FIG. 15, a shallow trench isolation region 172 is defined which overlaps the trench capacitor 180. Steps are performed to define a transistor in an active semiconductor region 174 of the SOI layer 102. For example, as illustrated in FIG. 15, a field effect transistor ("FET") having a source region S, a drain region D and a channel region C between the source and drain regions can be defined in the active semiconductor region 174 with a gate conductor G and gate dielectric Gox overlying the channel region. The FET may be connected to the node electrode 164 of the trench capacitor 180 through its source region S, by way of the second polysilicon layer 170. As further shown in FIG. 15, a trench top oxide 176 may overlie the trench capacitor 180.

While the invention has been described in accordance with certain preferred embodiments thereof, many modifications and enhancements can be made thereto without departing from the true scope and spirit of the invention, which is limited only by the claims appended below.

What is claimed is:

1. A method of forming a microelectronic device, comprising:
   (a) providing (i) a plurality of trenches extending vertically from an exposed major surface of a substrate through a plurality of layers of the substrate, (ii) a dielectric layer lining walls of the trenches and (iii) a plurality of exposed columnar elements overlying the dielectric layer within the trenches, the plurality of columnar elements extending vertically from within the trenches to different heights above the major surface;
   (b) recessing the columnar elements to below the major surface of the substrate by etching the columnar elements selectively with respect to a material exposed at the surface in an at least partly lateral direction so that the columnar elements are recessed to a uniform depth below the major surface at walls of the trenches without mechanically polishing the major surface and so that a surface of the dielectric layer is exposed above the uniform depth, wherein each columnar element has a top surface at a first depth below the major surface at a location within the trench away from a wall of the trench, the top surface being at a second depth below the major surface at the wall, the second depth being greater than the first depth, the first depth being determined by the etch time multiplied by the etch rate R;
   (c) removing exposed portions of the dielectric layer within the trenches above the uniform depth; and
   (d) forming microelectronic devices coupled to the columnar elements,
   wherein, after the columnar elements have been etched to the first depth, the exposed surfaces of each columnar element defines a "W" shape as viewed in cross-section, the method further comprising further recessing the columnar elements within the trenches to a second uniform depth from the major surface by a reactive ion etch (RIE) process.

* * * * *